(12) United States Patent
Hirayama et al.

(10) Patent No.: US 9,053,997 B2
(45) Date of Patent: Jun. 9, 2015

(54) SOLID-STATE IMAGE SENSOR, METHOD OF MANUFACTURING THE SAME, AND CAMERA WITH DUMMY PATTERNS

(71) Applicant: CANON KABUSHIKI KAISHA, Tokyo (JP)

(72) Inventors: Satoshi Hirayama, Yokohama (JP); Mariko Furuta, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 59 days.

(21) Appl. No.: 13/718,416

(22) Filed: Dec. 18, 2012

(65) Prior Publication Data
US 2013/0182162 A1 Jul. 18, 2013

(30) Foreign Application Priority Data
Jan. 18, 2012 (JP) .................... 2012-008449

(51) Int. Cl.
*H04N 5/225* (2006.01)
*H01L 27/146* (2006.01)
*H04N 5/369* (2011.01)

(52) U.S. Cl.
CPC .... *H01L 27/14603* (2013.01); *H01L 27/14683* (2013.01); *H04N 5/369* (2013.01)

(58) Field of Classification Search
None
See application file for complete search history.

(56) References Cited

U.S. PATENT DOCUMENTS

| 7,205,623 | B2 * | 4/2007 | Hong et al. | 257/435 |
| 2002/0097367 | A1 * | 7/2002 | Hirabayashi | 349/149 |
| 2006/0132633 | A1 * | 6/2006 | Nam et al. | 348/308 |
| 2008/0036023 | A1 * | 2/2008 | Park | 257/432 |
| 2008/0142919 | A1 * | 6/2008 | Shin | 257/435 |
| 2009/0166783 | A1 * | 7/2009 | Maruyama | 257/432 |
| 2011/0062540 | A1 | 3/2011 | Saito et al. | 257/432 |
| 2012/0224090 | A1 * | 9/2012 | Abe et al. | 348/308 |

FOREIGN PATENT DOCUMENTS

| JP | 62-142349 A | 6/1987 |
| JP | 3-76371 A | 4/1991 |
| JP | 5-21771 A | 1/1993 |
| JP | 2008-153486 A | 7/2008 |
| JP | 2008-288504 A | 11/2008 |
| JP | 2009-266989 A | 11/2009 |
| JP | 2011-61092 A | 3/2011 |

* cited by examiner

*Primary Examiner* — Twyler Haskins
*Assistant Examiner* — Dwight C Tejano
(74) *Attorney, Agent, or Firm* — Fitzpatrick, Cella, Harper & Scinto

(57) ABSTRACT

A solid-state image sensor having a pixel region and a peripheral circuit region, includes wiring lines arranged in the pixel region and the peripheral circuit region, dummy patterns arranged in the peripheral circuit region, and a planarizing layer arranged on the wiring lines and containing a resin. The wiring lines in the peripheral circuit region include a plurality of electrically conductive patterns. The dummy patterns are arranged between the plurality of electrically conductive patterns. The dummy patterns are electrically insulated from the wiring lines.

5 Claims, 3 Drawing Sheets

F I G. 1
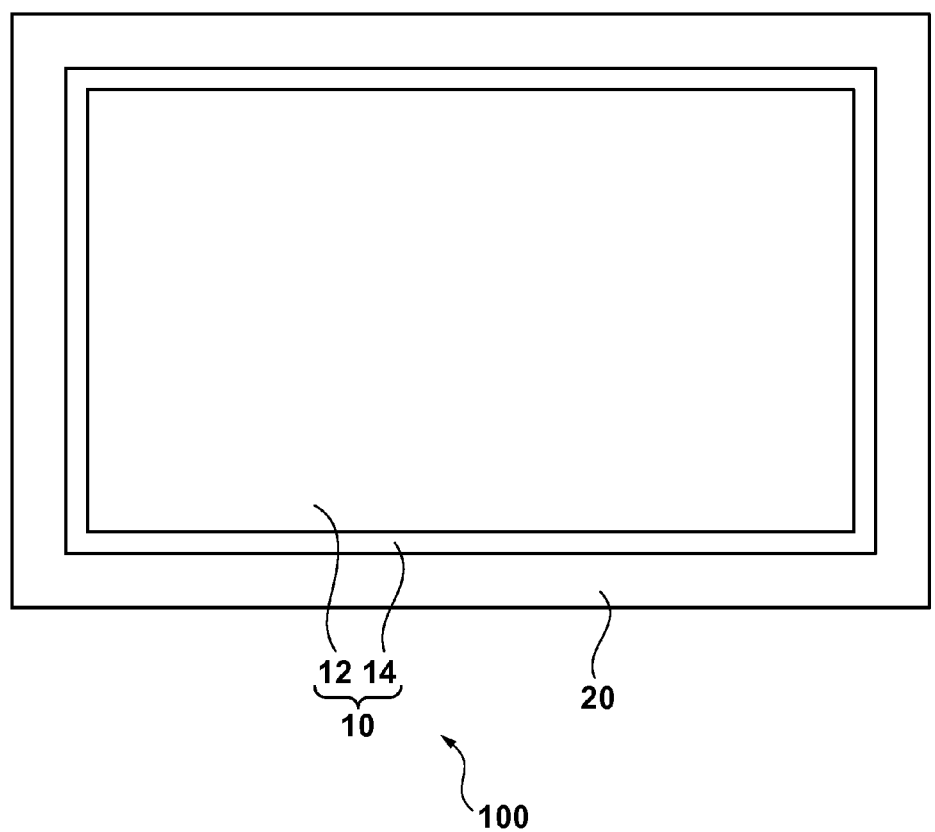

SOLID-STATE IMAGE SENSOR, METHOD OF MANUFACTURING THE SAME, AND CAMERA WITH DUMMY PATTERNS

BACKGROUND OF THE INVENTION

1. Field of the Invention

The present invention relates to a solid-state image sensor, a method of manufacturing the same, and a camera.

2. Description of the Related Art

On-chip color filters and microlenses are formed as optical components to improve the sensitivity of solid-state image sensors such as CMOS sensors which have been conventionally used for digital cameras and digital video cameras. A typical method of manufacturing a solid-state image sensor will be described with reference to FIGS. 3A and 3B. FIG. 3A is a sectional view of the peripheral circuit region of a solid-state image sensor. FIG. 3B is a sectional view of a pixel region of the solid-state image sensor. In a manufacturing process for a solid-state image sensor, after circuit elements such as photodiodes and transistors are formed on a semiconductor substrate, signal lines (conductive patterns) 122 for signal transfer can be formed.

Forming an insulating film covering the signal lines 122 can form an interlayer dielectric film 121 enclosing the signal lines 122 and can also form wiring lines 123 as power supply lines or signal lines on the interlayer dielectric film 121. Since there are gaps between a plurality of conductive patterns constituting the wiring lines 123, unevenness is formed on the surface of the substrate including the wiring lines 123. Coating the surface of the substrate with a resin by using a spin coat method can form a planarizing layer 131. In addition, it is possible to form a color filter 132 by coating the planarizing layer 131 with a pigment dispersant resist or a dye dissolved resist by the spin coat method and performing exposure and development processes on the resultant structure. A planarizing layer 133 can be formed on the color filter 132 by the spin coat method. Thereafter, it is possible to form microlenses 134 by coating the resultant structure with a photosensitive resin serving as a microlens material by the spin coat method and performing exposure, development, and baking processes on the resultant structure.

There is a tendency toward an on-chip structure having a digital circuit arranged in a peripheral circuit region for improvements in the quality and speed of a solid-state image sensor. A current flowing in such a digital circuit greatly varies. If the width of each wiring line 123 as a power supply line or a signal line arranged in the layer above a signal line exhibiting a large current variation is increased, the potential can become unstable due to the strong influence of variations in current flowing in the signal line 122 below the wiring line 123. It is therefore difficult to increase the width of the wiring line 123.

If, however, the width of each wiring line 123 decreases, since the area of each concave portion on the surface of the substrate increases, large unevenness 150 can be formed on the surface of the planarizing layer 131 formed on the wiring lines 123. The unevenness 150 on the surface of the planarizing layer 131 can be formed not only in the peripheral circuit region but also in the pixel region. The unevenness 150 on the surface of the planarizing layer 131 tends to increase at the time of formation of the planarizing layer 131 by the spin coat method. As a consequence, large unevenness can be formed not only in the peripheral circuit region but also in the pixel region. This is because, when the planarizing layer 131 is formed by the spin coat method, unevenness on the surface of the underlayer will cause coating unevenness in a region wider than the region in which the unevenness exists, and the coating unevenness forms the film thickness distribution of the planarizing layer 131.

If unevenness exists on the surface of the planarizing layer 131 under the color filter 132, the film thickness of the color filter 132 can become uneven, or the shape of the microlenses 134 formed on the color filter 132 can become uneven. This can lead to a deterioration in the quality of images captured by the solid-state image sensor.

Japanese Patent Laid-Open No. 5-21771 has proposed a method of planarizing a surface by filling the distribution of concave portions with a polymeric material. This method, however, increases the number of steps.

SUMMARY OF THE INVENTION

The present invention has been made in consideration of the above problem, and provides a technique advantageous in planarizing the layer on wiring lines and decreasing the number of steps.

One of the aspects of the present invention provides a solid-state image sensor including a pixel region and a peripheral circuit region, the sensor comprising: wiring lines arranged in the pixel region and the peripheral circuit region; dummy patterns arranged in the peripheral circuit region; and a planarizing layer arranged on the wiring lines and containing a resin, wherein the wiring lines in the peripheral circuit region include a plurality of electrically conductive patterns, and the dummy patterns are arranged between the plurality of electrically conductive patterns, the dummy patterns being electrically insulated from the wiring lines.

Further features of the present invention will become apparent from the following description of exemplary embodiments with reference to the attached drawings.

BRIEF DESCRIPTION OF THE DRAWINGS

FIG. 1 is a view showing the configuration of a solid-state image sensor according to an embodiment of the present invention;

DESCRIPTION OF THE EMBODIMENTS

Figure 2A:
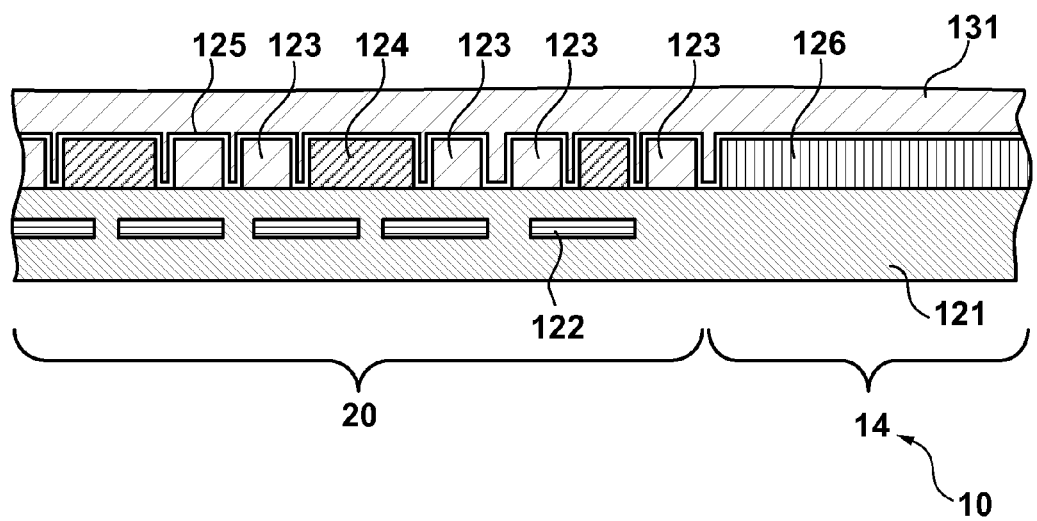
FIGS. 2A and 2B are sectional views schematically showing the configuration of the solid-state image sensor according to the embodiment of the present invention.

A solid-state image sensor of the present invention can be applied to various types of solid-state image sensors (for example, a CMOS sensor and a CCD sensor) having pixel regions and peripheral circuit regions. In this case, the pixel region is a region in which a plurality of pixels are arranged. Each pixel includes a photoelectric converting element (for example, a photodiode). The peripheral circuit region is a region different from the pixel region. The peripheral circuit region can include, for example, a circuit which supplies a control signal to an element (for example, a transistor) arranged in the pixel region and a circuit which processes a signal output from an element (for example, a transistor) or circuit arranged in the pixel region.

The solid-state image sensor includes wiring lines arranged in the pixel region and the peripheral circuit region and the dummy patterns arranged in the peripheral circuit region. The wiring line can include at least one of a power supply line and a signal line. The power supply line can include at least one of a power line and a ground line. In this case, a potential different from the ground potential applied to the ground line is applied to the power line. The wiring lines in the peripheral circuit region can include a plurality of electrically conductive patterns. The dummy patterns can be arranged between the plurality of electrically conductive patterns. The dummy patterns are electrically insulated from the wiring lines. The intervals between the electrically conductive patterns and the adjacent dummy patterns are preferably 30 μm or less. The wiring lines in the pixel region can be electrically connected to the wiring lines in the peripheral circuit region.

Although the wiring lines can be arranged in at least one of a plurality of wiring layers, they are preferably arranged in the uppermost wiring layer of the plurality of wiring layers. The solid-state image sensor can further include a planarizing layer which covers the uppermost wiring layer. The planarizing layer can contain a resin. The planarizing layer can be formed by the spin coat method. A color filter can be arranged on the planarizing layer. Alternatively, a color filter can be arranged on the planarizing layer, and microlenses can be arranged on the color filter.

A solid-state image sensor 100 and a method of manufacturing it will be described below with reference to the accompanying drawings.

FIG. 1 is a view showing the configuration of the solid-state image sensor 100 according to an embodiment of the present invention. The solid-state image sensor 100 includes a pixel region 10 and a peripheral circuit region 20. The pixel region 10 includes an effective pixel region 12 and an OB (Optical Black) region 14. A plurality of pixels can constitute a plurality of rows and a plurality of columns in the effective pixel region 12. Each pixel can include a photoelectric converting element. Light-shielded pixels are arranged in the OB region 14. The circuit configuration of light-shielded pixels can be identical to that of the pixels in the effective pixel region 12. Note that the OB region 14 is not always necessary.

For example, a vertical scanning circuit, horizontal scanning circuit, and signal processing circuit can be arranged in the peripheral circuit region 20. The signal processing circuit can include a readout circuit for reading out, for example, signals from the pixels selected by the vertical scanning circuit and the horizontal scanning circuit. The readout circuit can include an A/D converter which converts the analog signal read out from each pixel into a digital signal. The peripheral circuit region 20 can include, for example, at least one of a timing generator, a digital signal processing circuit (DSP), a parallel/serial converting circuit, and an LVDS (Low Voltage Differential Signaling) circuit.

Figure 2B:
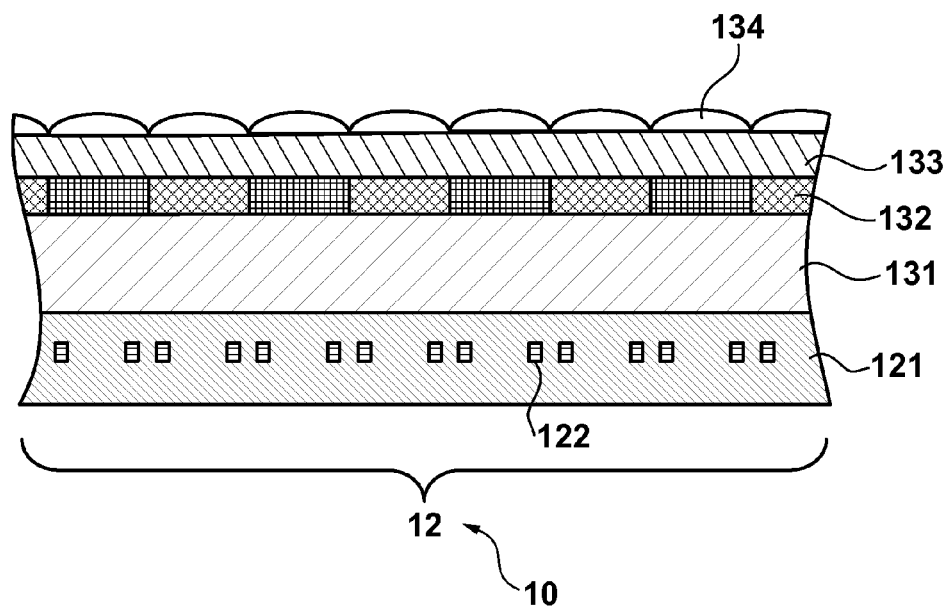

FIG. 2A is a sectional view schematically showing the configurations of the peripheral circuit region 20 and OB region 14 of the solid-state image sensor 100. FIG. 2B is a sectional view schematically showing the configuration of the effective pixel region 12 of the solid-state image sensor 100. The pixels arranged in the pixel region 10 including the effective pixel region 12 and the OB region 14 can include photoelectric converting elements (for example, photodiodes) formed in the semiconductor substrate. When the solid-state image sensor 100 is formed as a CMOS sensor, the pixels arranged in the pixel region 10 can include the transistors formed on the semiconductor substrate. The transistors can include, for example, transfer transistors for transferring the charges generated by the photoelectric converting elements to floating diffusions. The circuit arranged in the peripheral circuit region 20 includes transistors formed on the semiconductor substrate. FIGS. 2A and 2B omit photoelectric converting elements and transistors.

Signal lines (electrically conductive patterns) 122 for transmitting signals in the circuit arranged in the peripheral circuit region 20 are arranged in the peripheral circuit region 20. The signal lines 122 can include, for example, electrically conductive patterns constituting the signal lines of the above readout circuit.

The solid-state image sensor 100 includes wiring lines 123 arranged in the pixel region 10 (the effective pixel region 12 and the OB region 14) and the peripheral circuit region 20 and dummy patterns 124 arranged in the peripheral circuit region 20. Note that FIGS. 2A and 2B omit the wiring lines 123 arranged in the pixel region 10. The wiring lines 123 in the peripheral circuit region 20 can be arranged in a wiring layer close to the wiring layer in which the signal lines 122 are arranged. For example, the wiring lines 123 in the peripheral circuit region 20 can be arranged in the uppermost wiring layer of the plurality of wiring layers in the peripheral circuit region 20, and the signal lines 122 can be arranged in the wiring layer immediately below the uppermost wiring layer. The wiring lines 123 in the pixel region 10 can be electrically connected to the wiring lines 123 in the peripheral circuit region 20.

The wiring lines 123 in the peripheral circuit region 20 can include at least one of a power supply line and a signal line. The power supply lines can include at least one of a power line and a ground line. In this case, the wiring lines 123 in the peripheral circuit region 20 can include a plurality of electrically conductive patterns. The dummy patterns 124 can be arranged between a plurality of electrically conductive patterns constituting the wiring lines 123. The dummy patterns 124 are electrically insulated from the wiring lines 123. In a planar view, the dummy patterns 124 are arranged on the signal lines 122 so as to overlap them. In this case, a planar view is a view obtained by seeing the solid-state image sensor 100 from the direction of a normal to the upper surface. A planar view can also be an orthogonal projection view of an arbitrary surface such as the light-receiving surface of the solid-state image sensor. Note that the arrangement of the overlapped state described above may be an arrangement in which, for example, at least portions of the dummy patterns overlap the signal lines.

The OB region 14 is provided with a light-shielding film 126. In this case, the light-shielding film 126, the wiring lines 123, and the dummy patterns 124 can be formed from the same material in the same step. For example, a film is formed on the interlayer dielectric film 121 by using an electrically conductive material. Patterning this film by a photolithography process can form the light-shielding film 126, the wiring lines 123, and the dummy patterns 124.

The solid-state image sensor 100 can include the planarizing layer 131 which covers the wiring layer on which the wiring lines 123 are arranged. In this case, a protective film 125 may be formed to cover the light-shielding film 126, the wiring lines 123, and the dummy patterns 124, and a planarizing layer 131 may be formed on the protective film 125.

The planarizing layer 131 can be formed by coating the surfaces of the light-shielding film 126, wiring lines 123, and dummy patterns 124 with an organic material, for example, a resin such as an acrylic resin. As an acrylic resin, it is suitable to use AH859 or AH3101 available from JSR or CT-4000 available from Fuji Film Electronics Materials. A planarizing layer may be formed from an inorganic material as well as an organic material, which is a material that is coatable by the spin coat method.

Arranging the dummy patterns 124 between the plurality of electrically conductive patterns constituting the wiring lines 123 in the peripheral circuit region 20 can reduce the unevenness on the surfaces of the planarizing layer 131 not only in the peripheral circuit region 20 but also in the pixel region 10. In order to obtain the flatness of the surface of the planarizing layer 131, the intervals between the wiring lines 123 and the adjacent dummy patterns 124 are preferably 30 µm or less.

Figure 3A:
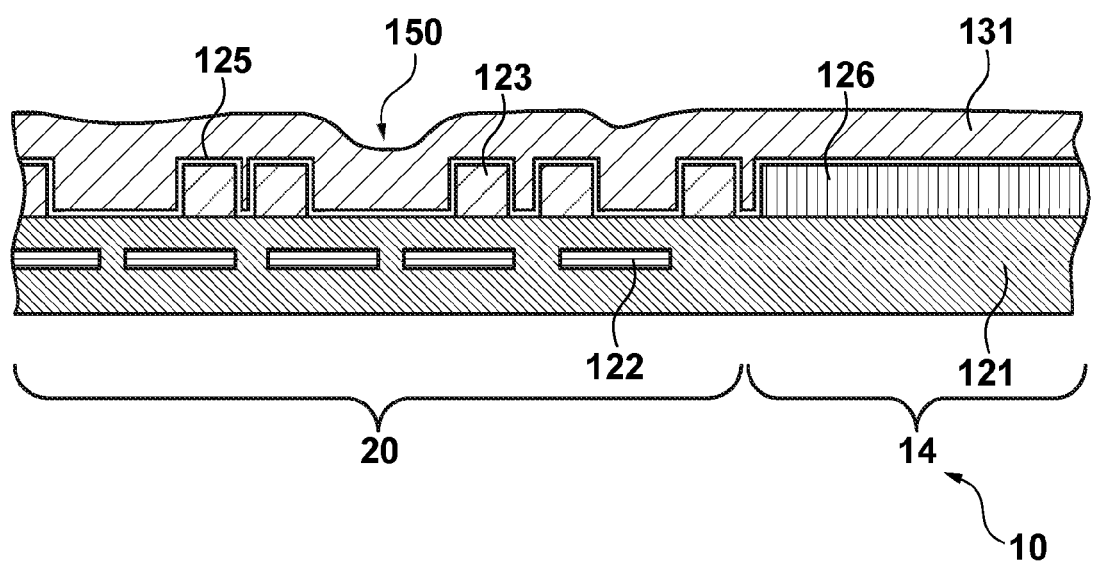
FIGS. 3A and 3B are sectional views schematically showing the configuration of a solid-state image sensor to which the present invention is not applied.
Figure 3B:
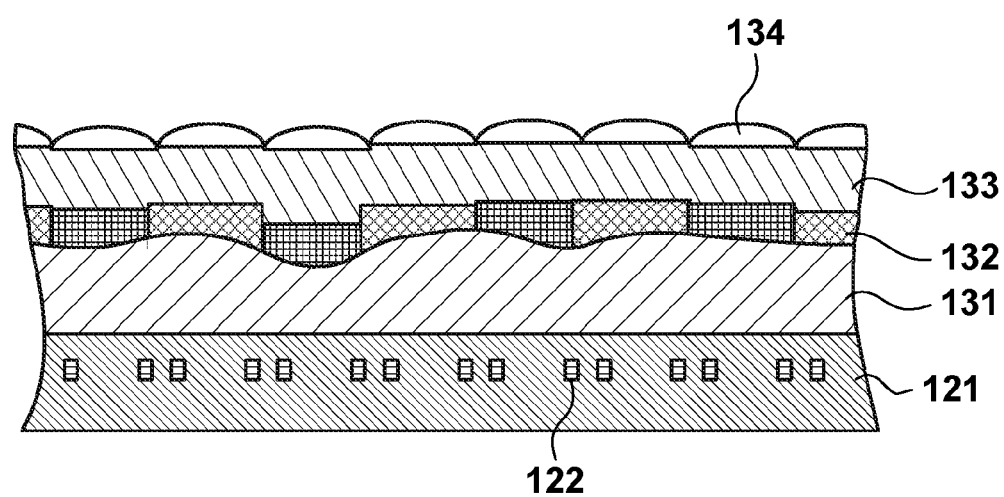

As schematically shown in FIGS. 3A and 3B, larger unevenness 150 is formed on the surface of the planarizing layer 131 without the dummy patterns 124 than with the dummy patterns 124. The unevenness 150 can be formed not only in the peripheral circuit region 20 but also in the pixel region 10. When the planarizing layer 131 is formed by the spin coat method, in particular, the unevenness formed on the surface of the peripheral circuit region 20 by the wiring lines 123 will cause coating unevenness on the resin. This can form large unevenness not only on the surface of the planarizing layer 131 in the peripheral circuit region 20 but also on the surface of the planarizing layer 131 in the pixel region 10.

A color filter 132 can be formed on the planarizing layer 131. Providing the dummy patterns 124 can arrange the color filter 132 on the planarizing layer 131 with reduced unevenness on the surface. This can reduce the thickness variation of the color filter 132 and sensitivity variation.

Microlenses 134 can be formed on the color filter 132. The microlenses 134 can be formed on, for example, a planarizing layer 133 on the color filter 132. Providing the dummy patterns 124 will reduce the unevenness on the surface of the color filter 132 or planarizing layer 133 below the microlenses 134. This can make the shape of the microlenses 134 uniform and reduce sensitivity variation. Note that the color filter 132 and the microlenses 134 are all arbitrary constituent elements.

A method of manufacturing the solid-state image sensor 100 according to an embodiment of the present invention includes the first and second steps. In the first step, the wiring lines 123 arranged in the pixel region 10 and the peripheral circuit region 20 and the dummy patterns 124 arranged in the peripheral circuit region 20 are formed. The wiring lines 123 and the dummy patterns 124 have the same thickness and arranged at the same height with respect to the surface of the semiconductor substrate. In the second step, the planarizing layer 131 is formed on the wiring lines 123 and the dummy patterns 124. In this case, the wiring lines 123 in the peripheral circuit region 20 include a plurality of electrically conductive patterns, and the dummy patterns 124 are arranged between the plurality of electrically conductive patterns. The dummy patterns 124 are electrically insulated from the wiring lines 123.

The wiring lines 123 can include portions functioning as pad portions. A plurality of pad portions are provided, and the dummy patterns can be provided between the pad portions. Although a fixed potential different from the voltage applied to the wiring lines 123 may be applied to the dummy patterns 124, the dummy patterns 124 preferably electrically float. Making the dummy patterns 124 electrically float can reduce the capacitances to the wiring lines 123. In addition, making the dummy patterns 124 electrically float can reduce the capacitances of the wiring lines on the lower layer.

As an application example of a solid-state image sensor according to each embodiment described above, a camera incorporating the solid-state image sensor will be exemplified. The concept of a camera includes a device having an imaging function as an auxiliary function (for example, a personal computer or cellular phone) as well as a device mainly aiming at imaging. A camera includes a solid-state image sensor according to the present invention, which has been exemplified as the above embodiment, and a processing unit which processes the signal output from the solid-state image sensor. The processing unit can include, for example, an A/D converter and a processor which processes the digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-008449, filed Jan. 18, 2012, which is hereby incorporated by reference herein in its entirety.

What is claimed is:

1. A solid-state image sensor including a pixel region and a peripheral circuit region, the sensor comprising:
   a signal line arranged in the peripheral circuit to transmit a signal to a circuit arranged in the peripheral region;
   a dielectric film arranged in the pixel region and the peripheral region, the signal line being arranged in the dielectric film;
   wiring lines arranged above the dielectric film, the wiring lines being arranged in the pixel region and the peripheral circuit region;
   dummy patterns arranged above the dielectric film, the dummy patterns being arranged in the peripheral circuit region; and
   a planarizing layer arranged above the wiring lines and the dummy patterns, the planarizing layer being arranged in the pixel region and the peripheral circuit region,
   wherein the wiring lines in the peripheral circuit region include a plurality of electrically conductive patterns, and the dummy patterns are arranged between the plurality of electrically conductive patterns, the dummy patterns being electrically insulated from the wiring lines,
   wherein the wiring lines and the dummy patterns constitute an uppermost wiring layer,
   wherein a wiring layer including the signal line and arranged immediately below the uppermost wiring layer is arranged in the dielectric film, and
   wherein the dummy patterns are arranged above the signal lines so as to overlap the signal lines in a planar view.

2. The sensor according to claim 1, wherein the dummy patterns electrically float.

3. The sensor according to claim 1, wherein the dummy patterns and the wiring lines arranged in the pixel region and the peripheral circuit region are the same in height.

4. A camera comprising:
   a solid-state image sensor defined in claim 1; and
   a processing unit which processes a signal output from the solid-state image sensor.

5. A solid-state image sensor including a pixel region and a peripheral circuit region, the sensor comprising:
   first wiring lines arranged in the peripheral circuit to transmit a signal to a circuit arranged in the peripheral region;
   a first wiring layer arranged in the pixel region and the peripheral region, the first signal line being arranged in the first wiring layer;
   second wiring lines arranged above the first wiring layer, the second wiring lines being arranged in the pixel region and the peripheral circuit region and including a plurality of electrically conductive patterns,
   dummy patterns arranged above the first wiring layer, the dummy patterns being arranged in the peripheral circuit region such that the dummy patterns are arranged between the plurality of electrically conductive patterns; and a second wiring layer arranged in the pixel region and the peripheral circuit region, the second wiring lines and the dummy patterns being arranged in the second wiring layer;

wherein the second wiring layer is an uppermost wiring layer, wherein the dummy patterns are electrically insulated from the second wiring layer, and wherein the dummy patterns are arranged above the first signal line so as to overlap the first signal line in a planar view.

* * * * *